(12) United States Patent
Schuster

(10) Patent No.: US 6,891,683 B2
(45) Date of Patent: May 10, 2005

(54) REFRACTIVE PROJECTION OBJECTIVE WITH A WAIST

(75) Inventor: Karl-Heinz Schuster, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 57 days.

(21) Appl. No.: 10/645,302

(22) Filed: Aug. 21, 2003

(65) Prior Publication Data

US 2004/0120051 A1 Jun. 24, 2004

Related U.S. Application Data

(63) Continuation of application No. PCT/EP03/01651, filed on Feb. 19, 2003.
(60) Provisional application No. 60/360,845, filed on Mar. 1, 2002.

(30) Foreign Application Priority Data

May 13, 2002 (DE) .......................................... 102 21 243
Jun. 28, 2002 (DE) .......................................... 102 29 249

(51) Int. Cl.[7] ............................ G02B 21/02; G02B 9/00
(52) U.S. Cl. ...................................... 359/754; 359/649
(58) Field of Search ................................ 359/649–651, 359/754

(56) References Cited

U.S. PATENT DOCUMENTS

| 6,008,884 A | 12/1999 | Yamaguchi et al. |
| 6,560,031 B1 | 5/2003 | Shafer et al. |
| 6,590,715 B2 | 7/2003 | Shafer et al. |

FOREIGN PATENT DOCUMENTS

| DE | 198 18 444 | 10/1998 |
| DE | 198 55 108 | 5/2000 |
| EP | 1 111 4254 | 6/2001 |
| WO | WO-03/075049 | 9/2003 |
| WO | WO-03/075096 | 9/2003 |
| WO | WO-03/075097 | 9/2003 |
| WO | WO-03/077036 | 9/2003 |
| WO | WO-03/077037 | 9/2003 |
| WO | WO-03/093904 | 11/2003 |

*Primary Examiner*—Scott J. Sugarman
(74) *Attorney, Agent, or Firm*—Darby & Darby

(57) ABSTRACT

A refractive projection objective for use in microlithography with lenses made exclusively of one and the same material has an image-side numerical aperture larger than 0.7. A light bundle defined by the image-side numerical aperture and by the image field has within the objective a variable light-bundle diameter smaller than or equal to a maximum light-bundle diameter. In a length interval measured on the optical axis from the system diaphragm towards the object field and at least equaling the maximum light-bundle diameter, the variable light-bundle diameter exceeds 85% of the maximum light-bundle diameter.

32 Claims, 6 Drawing Sheets

REFRACTIVE PROJECTION OBJECTIVE WITH A WAIST

CROSS-REFERENCE TO RELATED APPLICATION

This application is a continuation of International Patent Application Serial No. PCT/EP 03/01651 filed Feb. 19, 2003, which claims priority of U.S. Provisional Application Ser. No. 60/360,845 filed Mar. 1, 2002 and which is hereby incorporated by reference in its entirety.

BACKGROUND OF THE INVENTION

The invention relates to a projection system for making photographic exposures with a refractive projection objective. More specifically, the invention relates to the refractive projection objective itself as well as to a method involving the use of the projection system with the refractive projection objective in the manufacture of components carrying a microstructure. All lenses of the projection objective consist of the same material, and the numerical aperture of the projection objective on the image side is larger than 0.7.

The German patent application DE 198 18 444 A1 discloses refractive projection objectives that are designed for exposures with light of a wavelength of 248.4 nm, where all lenses of the projection objectives consist of a material which at the stated exposure wavelength have a refractive index of 1.50839 which is characteristic of, e.g., quartz glass.

The aforementioned reference further discloses that when image aberrations occur, they can be corrected by a targeted use of aspheres. For example, as mentioned in this reference, an image distortion occurring with the projection objective can be corrected by using an asphere in the first lens group, which in this case is a lens group of positive refractive power. Further according to the same reference, entrance pupil aberrations occurring in the projection objective can be corrected by including an asphere in the second lens group, which is a group of negative refractive power and forms a first waist of the projection objective. It is also known that by arranging an aspheric lens surface in the third lens group it is possible to minimize a coma effect that may be present in the projection objective, where the third lens group is a group of positive refractive power and is arranged between the two waists (second and fourth lens group). A coma effect occurring in the objective can likewise be minimized by arranging an asphere in the sixth lens group, which is of positive refractive power and is arranged directly in front of the wafer. Through the use of an asphere in the fifth lens group, which is of positive refractive power, it is possible to correct aberrations associated with a large numerical aperture, in particular spherical aberrations. A correction of spherical aberrations is also possible by arranging an asphere in the fourth lens group, as long as the asphere is arranged close to the image plane.

As disclosed in U.S. Pat. No. 5,668,672, chromatic aberrations can be corrected by using quartz glass in combination with a fluoride material as lens materials. Further known from U.S. Pat. No. 6,377,338 is a refractive projection objective, in which chromatic aberrations are corrected by using a combination of two or more kinds of fluoride crystals. The projection objective shown in FIG. 11 of U.S. Pat. No. 6,377,338, which is designed for a wavelength of 157 nm, includes several aspheres. The lens materials proposed for use at this wavelength include in particular calcium fluoride and lithium fluoride.

In the U.S. patent application Ser. No. 09/694,878 (EP 1094350 A), the use of individual calcium fluoride lenses is proposed for the correction of chromatic aberrations in an objective designed for the wavelength of 193 nm wherein most of the lenses consist of quartz glass. The projection objective presented in FIG. 1 of this reference is a refractive objective with a numerical aperture of 0.7 and includes a lens group of negative power providing a clearly defined waist that is identified in the drawing as G2.

A projection objective that is likewise designed for a wavelength of 193 nm is described in U.S. Pat. No. 6,522,484. This lens system has a numerical aperture of 0.7 and the specified lens materials are quartz glass and calcium fluoride used in combination. The projection objectives proposed in this reference further have at least two lens groups of negative power, each of which produces a clearly defined waist in the light path geometry.

Refractive lens systems are described in EP 1139138 A1, in which the lenses consist of the materials calcium fluoride and quartz glass. An example of an objective designed for a wavelength of 157 nm is shown in which all lenses consist of calcium fluoride. Other lens arrangements presented in the same reference are designed for the wavelength of 193 nm. Each of the lens systems described includes a plurality of aspheres.

Using calcium fluoride, e.g., in a lens system designed for exposures at a wavelength of 193 nm has the disadvantages that on the one hand calcium fluoride is not as readily available as quartz glass and on the other hand it is also significantly more expensive.

OBJECT OF THE INVENTION

The invention therefore has the objective to propose refractive lens arrangements, more specifically a microlithography projection system for making photographic exposures with a refractive projection objective, with a large numerical aperture and good optical qualities.

As a further objective, the invention aims to provide refractive lens systems for use in microlithography which offer a large numerical aperture in combination with small longitudinal chromatic aberrations.

The invention further has the objective to provide refractive lens systems at reduced manufacturing cost.

SUMMARY OF THE INVENTION

According to the invention, the objectives outlined above are met by a refractive projection objective which has an optical axis, an object field, a system diaphragm, and an image field, wherein all lenses of the objective consist of the same material, wherein a maximum lens diameter can be identified among the lenses of the objective, and wherein the image-side numerical aperture of the objective is greater than 0.7. A light bundle traversing the objective from the object field to the image field is defined by the image-side numerical aperture and by the image field, and a maximum light bundle diameter exists relative to the entire light path between the object field and the image field. According to the invention, the objective is designed so that in an axial length interval at least equal to the maximum lens diameter or the maximum light bundle diameter and extending from the diaphragm towards the object field, the light bundle has a diameter that is larger than 85% of the maximum lens diameter or the maximum light bundle diameter.

Due to the measure of specifying the same material for all of the lenses, the manufacturing cost can be lowered even for the reason alone that the higher costs for procuring different materials are avoided.

The invention also provides a solution for a purely refractive objective which is made with only one lens material and provides a good level of correction for chromatic aberrations in applications where the objective is used as a microlithography projection objective with a large image-side numerical aperture and a large image field. As the chromatic aberration increases with increasing bandwidth of the light used for the exposure, the restriction on the bandwidth of the exposure light can be relaxed only by using an objective with an exceptionally effective correction of the chromatic aberration, in particular the longitudinal chromatic aberration, without having to tolerate a deterioration in image quality.

The objective should be suited in particular for wavelengths of 157 nanometers and 193 nanometers. As an unexpected result, it was found that even with the complex boundary conditions imposed on a high-quality microlithography projection objective, measures can be taken with regard to the arrangement and the design of the lenses so that at a given amount of dispersion, a noticeable reduction of the longitudinal chromatic aberration is achieved with a single lens material. Among the measures that can be taken, it has proven to be advantageous if positive refractive power is moved towards the image in order to keep the longitudinal chromatic aberration small.

The high-order Petzval correction that is necessary in lens arrangements of this type requires a design with waists of negative refractive power.

An arrangement where a doublet consisting of a positive lens and a negative lens is placed after the first waist with a large lens diameter of at least 85% of the maximum lens diameter or the maximum light bundle diameter provides the possibility to optimize the correction in regard to all aperture-related non-axial image aberrations without causing longitudinal chromatic aberrations.

Particularly the area ahead of the system diaphragm and the area of the diaphragm itself are predisposed to cause longitudinal chromatic aberrations. Because of this problem, it has proven to be advantageous to arrange lens doublets in the area ahead of and in the immediate vicinity of the system diaphragm, with each doublet having a positive lens coordinated with a negative lens that is positioned close to the positive lens and has a similar light bundle diameter. Doublets with a combined refractive power of less than 20% of the refractive power between the diaphragm and the wafer were found particularly advantageous. The outside contour shape of the doublets resembles a thick curved meniscus that has a relatively small refractive power.

It has proven advantageous to provide a trace of a second waist in the form of two consecutive negative lenses placed between two positive lenses. Because of the large lens diameter of the negative lenses, the light bundle diameter is constricted only slightly in this second waist, in particular less than 10% of the maximum lens diameter occurring ahead of this waist. This has a beneficial effect on the longitudinal chromatic aberration.

Using aspheres in an opening group consisting of negative lenses has the advantage that the possibilities of the Petzval correction, in particular the field curvature correction, are not stretched to the limit.

BRIEF DESCRIPTION OF THE DRAWINGS

In the following, the invention will be described in more detail based on specific embodiments, which represent examples and are not to be interpreted as limitations of the scope of the invention. The description refers to the attached drawings, wherein.

DETAILED DESCRIPTION OF PREFERRED EMBODIMENTS

Figure 1:
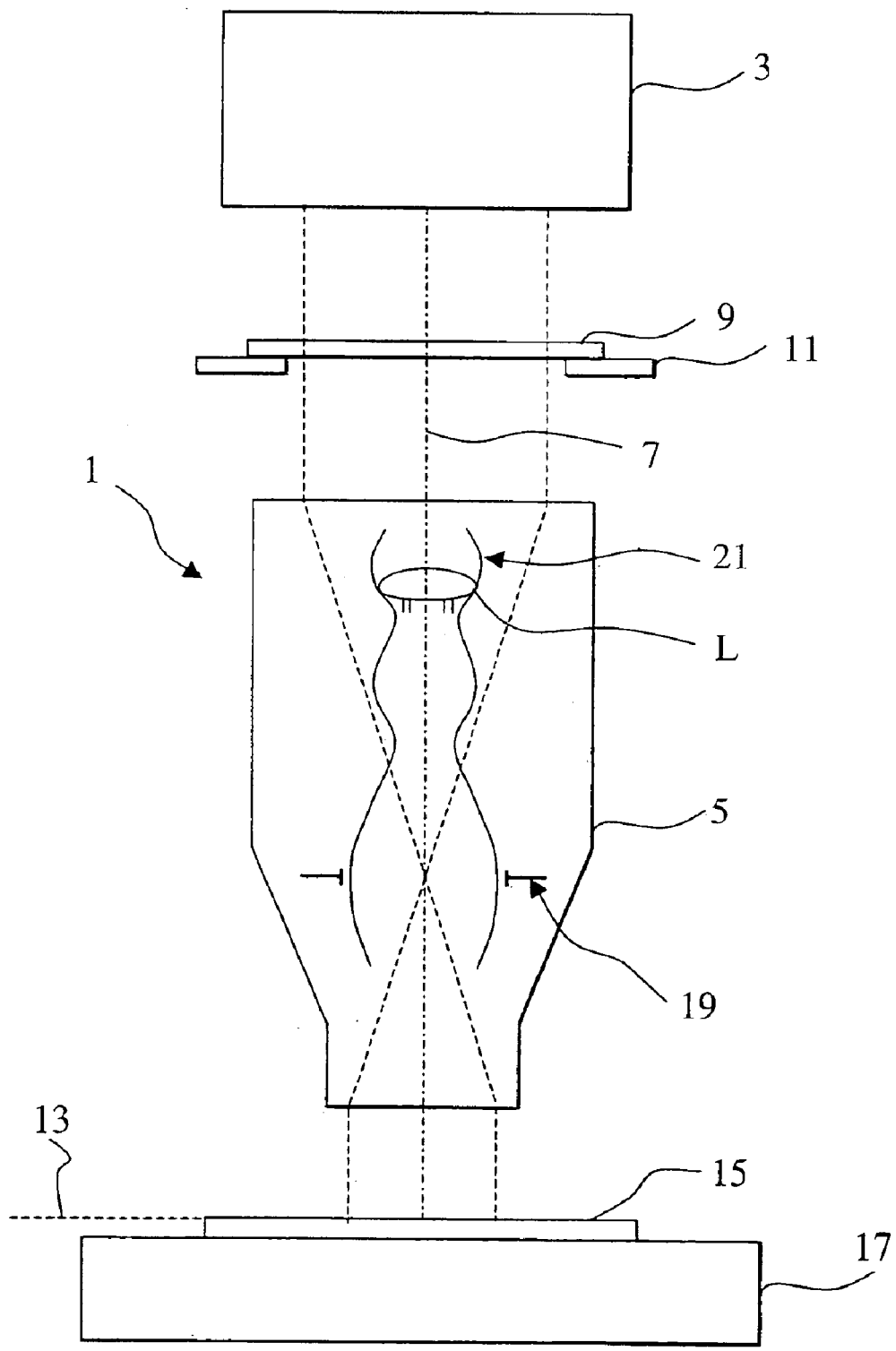
FIG. 1 represents a microlithography projection system.

FIG. 1 serves to describe the principal layout of a projection system 1 for photographic exposures with a refractive projection objective 5. The projection system 1 has an illumination device 3 that is equipped with a means for narrowing the bandwidth. The projection objective 5 comprises a lens arrangement 21 with a system diaphragm 19, where the lens arrangement 21 defines an optical axis 7. A mask 9, which is held in the light path by means of a mask holder 11, is arranged between the illumination device 3 and the projection objective 5. Masks 9 of the kind used in microlithography carry a structure with detail dimensions in the micrometer to nanometer range, which is projected by means of the objective 5 onto an image plane 13 with a reduction in size by as much as a factor of 10, in particular a factor of 4. A substrate or wafer 15 is held in the image plane 13 by a substrate holder 17. The smallest detail dimensions of the structures that can be resolved in the image depend on the wavelength of the light used for the exposure and also on the numerical aperture of the projection objective 5 as well as a K-factor. The maximum level of resolution that can be achieved with the projection system 1 increases with smaller wavelengths of the light bundle 23 that is produced by the illumination device 3 and through which the pattern of the mask 9 is projected onto the wafer 15 by means of the projection objective 5.

The design of different lens arrangements 21 of projection objectives 5 for the wavelengths of 193 nm and 157.6 is described on the basis of FIGS. 2 to 6, with the terms projection objective and lens arrangement being used interchangeably.

Figure 2:
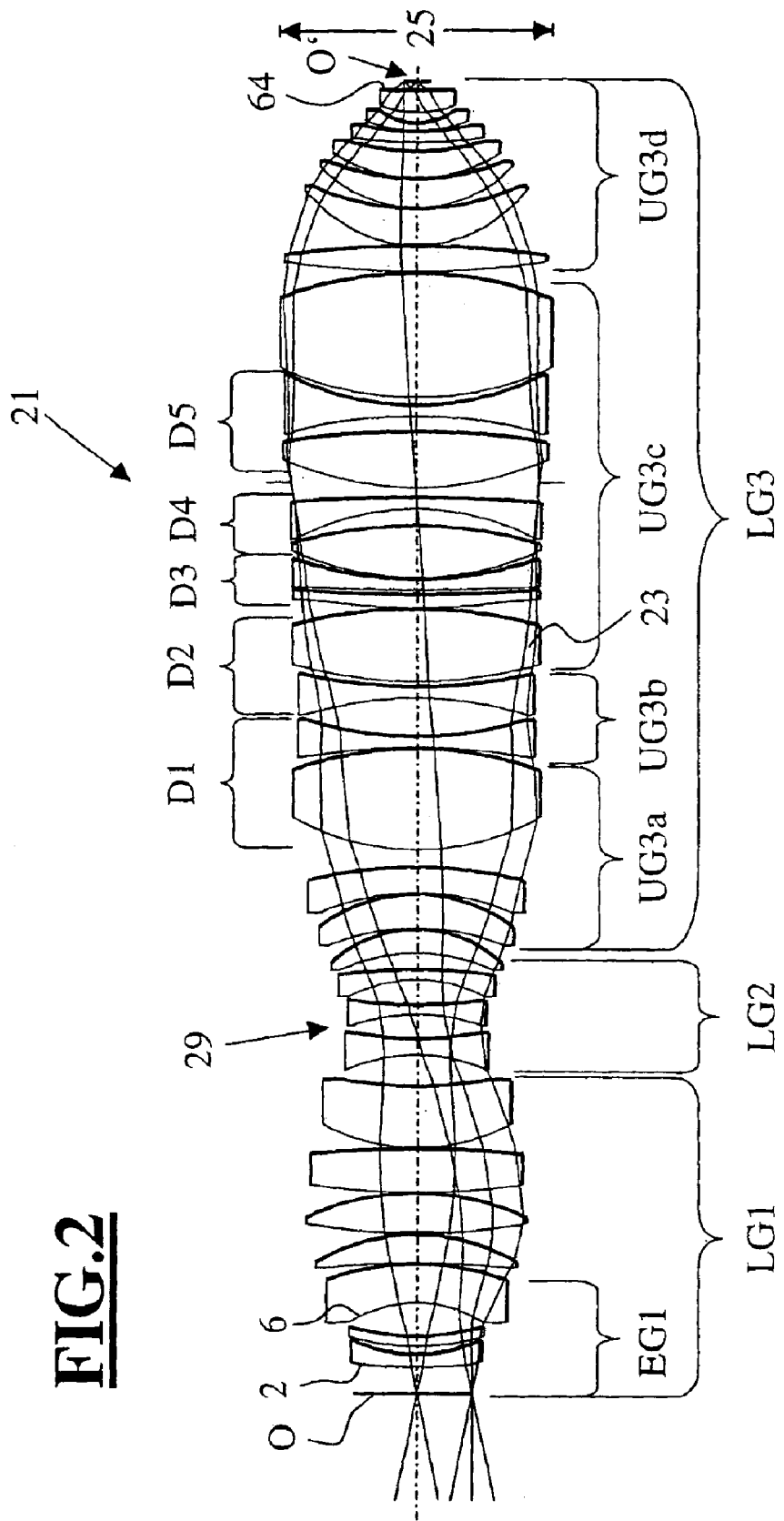
FIG. 2 represents a refractive projection objective with a length of 1340.7 mm and a numerical aperture of 0.8 for applications in microlithography with an exposure light wavelength of 193 nm.

The refractive lens arrangement 21 shown in FIG. 2 is designed for the exposure light wavelength of 193 nanometers and has an image-side numerical aperture of 0.8. This lens arrangement 21 has 31 lenses, nine of which have at least one aspheric lens surface. This type of lens is also referred to as an asphere. The length from the object plane O to the image plane O' is 1340.7 mm.

The lens arrangement 21 of FIG. 2 can be subdivided into three lens groups LG1 to LG3. The first lens group LG1 has a positive refractive power and includes the lenses with the surfaces 2–15. The lens group LG1, in turn, can be subdivided into an opening group EG1 which has negative refractive power and includes the first three lenses. The first two lenses on the object side have aspheres arranged on a convex lens surface on the side facing the object. These first two lenses are curved towards the object.

The lenses that follow the opening group EG1 form a bulge. These thick positive lenses have a favorable effect on the Petzval sum and also make a favorable contribution in regard to the coma correction. The last lens of the lens group LG1 has an aspherical surface on the side that faces towards the wafer.

The second lens group LG2 is made up of the lenses with the lens surfaces 16–21. The first and the last lens surface in this group are aspherical. The lens group has a negative refractive power and forms a distinct waist. Thus, this lens group makes a particularly valuable contribution to the correction of the higher-order sagittal spherical aberrations. At the same time, this lens group provides the main contribution to the Petzval correction, in particular the flattening of the image curvature.

The second lens group is followed by the third lens group LG3, which is composed of the lenses with the lens surfaces 22–64. The most noticeable trait of this lens group is its elongated tubular appearance. This shape is the result of an elongated portion in the area ahead of the system diaphragm. This portion of the third lens group has a light bundle diameter or a lens diameter equal to at least 85% of the maximum lens diameter or the maximum light bundle diameter. Due to this configuration, it was possible to achieve favorable optical properties, particularly in regard to a longitudinal chromatic aberration, in an objective using only a single lens material. Especially the portion ahead of the system diaphragm 19 and the immediate vicinity of the system diaphragm are for principal reasons particularly critical sources of longitudinal chromatic aberration. In the illustrated example, four doublets are arranged ahead of the system diaphragm 19, each consisting of a positive lens and a negative lens. A further doublet consisting of a positive lens followed by a negative lens is arranged after the system diaphragm 19. A large portion of the refractive power of the objective is provided by a thick positive lens that follows after these doublets. An end portion of the third lens group LG3, identified as UG3d in FIG. 2 and composed of the lenses with the lens surfaces 31–54 has a favorable effect on the negative image distortion. The design of the end portion UG3d is essential in that it enables a very high aperture of 0.8 with an optimal degree of correction, because it contributes only to a small extent to the spherical aberration and coma.

A weakly curved waist of two successive negative lenses that are arranged ahead of the system diaphragm is identified as UG3b. The lenses with the lens surfaces 22–29, identified collectively as UG3a, form a positive subgroup that represents an atypical bulge.

The projection objective shown in FIG. 2 allows an image field with an area of 10.5×26 mm$^2$ to be exposed, with the structure of the object being projected onto a wafer with a reduction factor of 4.

Table 1 represents the Code V™ data for the embodiment of the inventive objective that is illustrated in FIG. 2.

TABLE 1

| SURFACE | RADIUS | THICKNESS | MATERIAL | REFR. INDEX 193.304 nm | ½ FREE DIAMETER |
|---|---|---|---|---|---|
| 0 | 0.000000000 | 24.114319875 | N2 | 1.00000320 | 56.080 |
| 1 | 0.000000000 | 3.482434220 | N2 | 1.00000320 | 61.002 |
| 2 | 2078.963770280AS | 11.540852046 | SIO2HL | 1.56028895 | 62.455 |
| 3 | 149.559792284 | 8.045820053 | N2 | 1.00000320 | 63.745 |
| 4 | 283.335388909AS | 10.384447026 | SIO2HL | 1.56028895 | 65.015 |
| 5 | 227.471174739 | 35.446688452 | N2 | 1.00000320 | 66.284 |
| 6 | −122.782367295 | 38.508940817 | SIO2HL | 1.56028895 | 68.210 |
| 7 | −255.078934826 | 0.874570041 | N2 | 1.00000320 | 89.183 |
| 8 | −888.725542480 | 30.171005105 | SIO2HL | 1.56028895 | 95.735 |
| 9 | −191.846579966 | 0.675200957 | N2 | 1.00000320 | 98.735 |
| 10 | 640.397878968 | 41.049504805 | SIO2HL | 1.56028895 | 108.485 |
| 11 | −250.387321692 | 0.675200957 | N2 | 1.00000320 | 109.147 |
| 12 | 667.678997977 | 44.017612594 | SIO2HL | 1.56028895 | 105.073 |
| 13 | −1125.455416998 | 0.675200957 | N2 | 1.00000320 | 100.899 |
| 14 | 192.876693777 | 62.505832714 | SIO2HL | 1.56028895 | 93.072 |
| 15 | 331.893780633AS | 32.604997110 | N2 | 1.00000320 | 76.483 |
| 16 | −171.193877443AS | 17.084502546 | SIO2HL | 1.56028895 | 70.652 |
| 17 | 335.138365959 | 24.373437146 | N2 | 1.00000320 | 66.301 |
| 18 | −192.572424355 | 9.645727950 | SIO2HL | 1.56028895 | 65.926 |
| 19 | 418.847934941 | 26.888457292 | N2 | 1.00000320 | 68.374 |
| 20 | −140.483410076 | 10.610300745 | SIO2HL | 1.56028895 | 69.129 |
| 21 | −459.758634782AS | 16.193911170 | N2 | 1.00000320 | 77.669 |
| 22 | −188.260511338 | 24.787222412 | SIO2HL | 1.56028895 | 79.453 |
| 23 | −123.558724879 | 1.174436845 | N2 | 1.00000320 | 84.227 |
| 24 | −224.101808279 | 35.439166118 | SIO2HL | 1.56028895 | 89.392 |
| 25 | −158.235875230 | 1.137750024 | N2 | 1.00000320 | 97.007 |
| 26 | −244.923106839 | 26.771118597 | SIO2HL | 1.56028895 | 99.234 |
| 27 | −435.595962845 | 19.019537360 | N2 | 1.00000320 | 108.190 |
| 28 | 254.503542501 | 103.741855324 | SIO2HL | 1.56028895 | 125.704 |
| 29 | −370.013146990 | 0.898100644 | N2 | 1.00000320 | 123.190 |
| 30 | −651.149669203AS | 11.574873540 | SIO2HL | 1.56028895 | 119.614 |
| 31 | 346.341133415 | 40.118210584 | N2 | 1.00000320 | 114.229 |
| 32 | −378.937108427 | 11.574873540 | SIO2HL | 1.56028895 | 114.195 |
| 33 | 532.696677413 | 4.927372582 | N2 | 1.00000320 | 118.682 |
| 34 | 439.556363278 | 74.374706500 | SIO2HL | 1.56028895 | 121.399 |
| 35 | −502.601956332 | 0.675200957 | N2 | 1.00000320 | 124.801 |
| 36 | 522.145069309AS | 14.799644077 | SIO2HL | 1.56028895 | 124.414 |
| 37 | 1476.224552423 | 4.677319062 | N2 | 1.00000320 | 124.271 |
| 38 | 2177.900420777 | 11.574873540 | SIO2HL | 1.56028895 | 124.349 |
| 39 | 384.316107261 | 1.595817333 | N2 | 1.00000320 | 124.241 |
| 40 | 312.429605405 | 51.750696421 | SIO2HL | 1.56028895 | 125.681 |

TABLE 1-continued

| | | | | | |
|---|---|---|---|---|---|
| 41 | −432.173779349 | 17.813396316 | N2 | 1.00000320 | 125.439 |
| 42 | −249.375527898 | 11.574873540 | SIO2HL | 1.56028895 | 124.719 |
| 43 | −1589.233069199 | 14.468591925 | N2 | 1.00000320 | 127.374 |
| 44 | 0.000000000 | −4.822863975 | N2 | 1.00000320 | 125.296 |
| 45 | 321.301154865 | 57.691242734 | SIO2HL | 1.56028895 | 131.351 |
| 46 | −1054.206205699AS | 14.951798157 | N2 | 1.00000320 | 130.208 |
| 47 | −589.044474927AS | 11.574873540 | SIO2HL | 1.56028895 | 128.575 |
| 48 | 274.036317071 | 8.139476302 | N2 | 1.00000320 | 128.119 |
| 49 | 321.225611416 | 124.977354157 | SIO2HL | 1.56028895 | 129.264 |
| 50 | −395.919230783 | 1.969428424 | N2 | 1.00000320 | 131.721 |
| 51 | 820.198727366 | 26.845651259 | SIO2HL | 1.56028895 | 126.931 |
| 52 | −973.939543882 | 0.694000123 | N2 | 1.00000320 | 125.647 |
| 53 | 139.833041863 | 36.229940671 | SIO2HL | 1.56028895 | 107.077 |
| 54 | 242.551698933 | 0.867355440 | N2 | 1.00000320 | 102.010 |
| 55 | 131.386059685 | 29.928967379 | SIO2HL | 1.56028895 | 91.857 |
| 56 | 235.274124558 | 0.675200957 | N2 | 1.00000320 | 85.440 |
| 57 | 157.034314790 | 26.536117143 | SIO2HL | 1.56028895 | 79.168 |
| 58 | 231.201718823 | 9.219970606 | N2 | 1.00000320 | 66.512 |
| 59 | 470.035875032 | 11.197726405 | SIO2HL | 1.56028895 | 61.464 |
| 60 | 236.045204498 | 0.675200957 | N2 | 1.00000320 | 52.281 |
| 61 | 134.300351512 | 8.120819966 | SIO2HL | 1.56028895 | 48.003 |
| 62 | 63.666959363 | 10.716266548 | N2 | 1.00000320 | 38.339 |
| 63 | 108.784923745 | 21.847901284 | SIO2HL | 1.56028895 | 35.245 |
| 64 | 693.402002382 | 8.681155155 | N2 | 1.00000320 | 24.992 |
| 65 | 0.000000000 | 0.000000000 | N2 | 1.00000320 | 14.020 |
| 66 | 0.000000000 | 0.000000000 | | 1.00000000 | 14.020 |

ASPHERIC CONSTANTS

| | SURFACE NO. 2 | | SURFACE NO. 4 | | SURFACE NO. 15 |
|---|---|---|---|---|---|
| C0 | 0.0000 | C0 | 0.0000 | C0 | 0.0000 |
| C1 | 2.14106637e−007 | C1 | 8.34485767e−008 | C1 | −2.63006449e−008 |
| C2 | −1.51669986e−011 | C2 | 6.40722335e−012 | C2 | −2.79471341e−012 |
| C3 | 2.64769647e−015 | C3 | −1.82542397e−015 | C3 | −2.67096228e−016 |
| C4 | −3.99036396e−019 | C4 | 2.34304470e−019 | C4 | −1.35138372e−020 |
| C5 | 2.47505843e−023 | C5 | −8.26711198e−024 | C5 | −4.40665654e−024 |
| C6 | −3.15802350e−028 | C6 | −7.65863767e−028 | C6 | 5.04322571e−028 |
| C7 | 3.03036722e−032 | C7 | 6.41110903e−032 | C7 | −7.87867135e−032 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| | SURFACE NO. 16 | | SURFACE NO. 21 | | SURFACE NO. 30 |
|---|---|---|---|---|---|
| C0 | 0.0000 | C0 | 0.0000 | C0 | 0.0000 |
| C1 | 3.25803022e−009 | C1 | 4.82674733e−008 | C1 | −1.45094804e−009 |
| C2 | −6.94860276e−013 | C2 | 1.36227355e−012 | C2 | 5.04456796e−013 |
| C3 | −1.78049294e−016 | C3 | −9.54833030e−017 | C3 | −5.09450648e−018 |
| C4 | −6.94438259e−021 | C4 | 9.50143078e−022 | C4 | −1.99406773e−022 |
| C5 | 6.12556670e−024 | C5 | 5.69193655e−025 | C5 | −1.14064975e−026 |
| C6 | −1.48556644e−027 | C6 | −3.40684947e−029 | C6 | 5.78307927e−031 |
| C7 | 1.00088938e−031 | C7 | 2.94651178e−033 | C7 | −1.43630501e−035 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| | SURFACE NO. 36 | | SURFACE NO. 46 | | SURFACE NO. 47 |
|---|---|---|---|---|---|
| C0 | 0.0000 | C0 | 0.0000 | C0 | 0.0000 |
| C1 | −1.43259985e−008 | C1 | −7.44300951e−010 | C1 | −7.10390913e−009 |
| C2 | −3.56045780e−013 | C2 | −1.00597848e−013 | C2 | 1.80939707e−014 |
| C3 | −7.68193084e−018 | C3 | −1.16300854e−017 | C3 | −1.34383300e−017 |
| C4 | −1.87091119e−022 | C4 | 3.24986044e−023 | C4 | −1.50233953e−023 |
| C5 | −1.28218449e−026 | C5 | 5.82666461e−027 | C5 | 7.80860338e−027 |
| C6 | 3.62372568e−031 | C6 | −4.12661445e−031 | C6 | −4.98388772e−031 |
| C7 | −2.39455297e−035 | C7 | 6.25538499e−036 | C7 | 9.26846573e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

Figure 3:
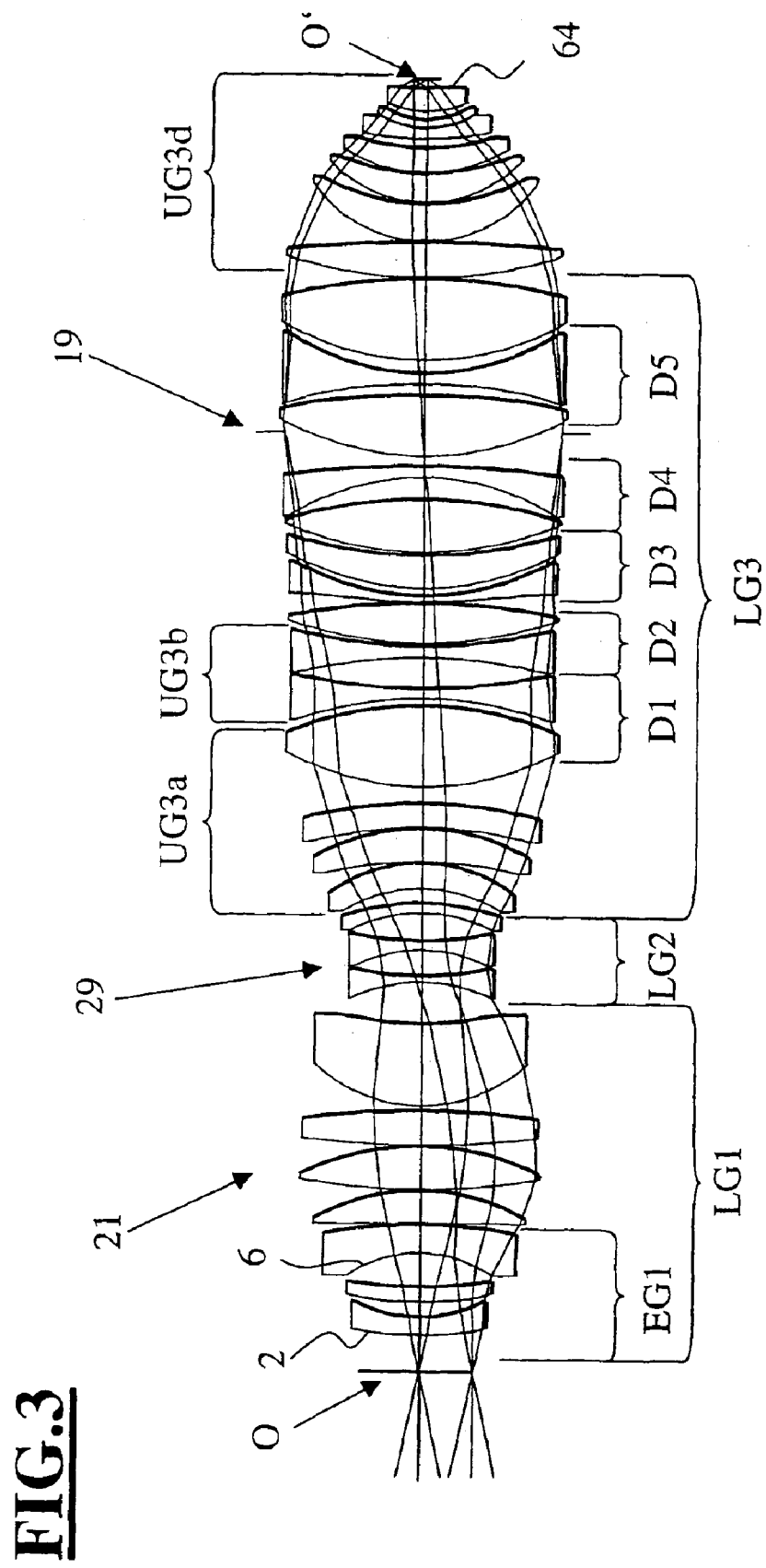
FIG. 3 represents a projection objective with a length of 1344 mm and a numerical aperture of 0.85 designed for a wavelength of 193 nm.

The following description relates to a further purely refractive lens arrangement 21 which is illustrated in FIG. 3 and is likewise designed for light with a wavelength of 193 nm. The length of the lens arrangement 21, measured from the object plane O to the image plane O', is 1344.0 mm. A field of 10.5×26 mm² can be exposed. The lens arrangement of FIG. 3 again has an opening group EG1 formed by the first lenses arranged on the object side, which are of negative refractive power. The subsequent lenses with the surfaces 8–15 form a lens group LG1. The last lens surface 15 of this lens group is again aspheric on the wafer side.

The subsequent lenses with the surfaces 16–21 form a third lens group LG2. This third lens group LG2 overall has a negative refractive power and forms a strongly curved waist 29. This lens group is followed by a fourth lens group LG3, which has an elongated tubular shape. A system diaphragm 19 is arranged in this fourth lens group. On the side facing towards the third lens group LG2 and thus facing towards the object field, the fourth lens group LG3 has a subgroup UG3*a* with a small positive refractive power. This is followed by a weakly curved waist UG3*b* formed by two negative lenses with a large diameter equal to at least 85% of the maximum diameter. The two negative lenses belong to the doublets D1 and D2. There are two further doublets, identified as D3 and D4, arranged ahead of the system diaphragm 19. A further doublet is identified as D5 with aspheres on both of its surfaces 46 and 47. The final portion, identified as G3*d*, is made up of a plurality of thin lenses by which the wide light bundle 23 is focused onto the image plane, i.e., onto the wafer.

The image-side numerical aperture is 0.85. This objective projects the object into the image plane 13 with a reduction factor of 4. The data for all of the lenses are listed in Table 2.

TABLE 2

| SURFACE | RADIUS | THICKNESS | MATERIAL | REFR. INDEX 193.304 nm | ½ FREE DIAMETER |
|---|---|---|---|---|---|
| 0 | 0.000000000 | 24.172413800 | N2 | 1.00000320 | 56.080 |
| 1 | 0.000000000 | 15.006569837 | N2 | 1.00000320 | 61.282 |
| 2 | 599.473674706AS | 17.471359581 | SIO2HL | 1.56028895 | 65.688 |
| 3 | 142.945533106 | 15.594383723 | N2 | 1.00000320 | 67.351 |
| 4 | 520.792476125AS | 15.866311924 | SIO2HL | 1.56028895 | 70.201 |
| 5 | 458.213670894 | 35.531230748 | N2 | 1.00000320 | 72.731 |
| 6 | −130.942246277 | 29.261434955 | SIO2HL | 1.56028895 | 75.090 |
| 7 | −522.434408367 | 1.046065674 | N2 | 1.00000320 | 96.747 |
| 8 | −6686.031621900 | 34.314309045 | SIO2HL | 1.56028895 | 103.359 |
| 9 | −218.186494807 | 0.676827586 | N2 | 1.00000320 | 106.388 |
| 10 | 706.363261168 | 45.122462397 | SIO2HL | 1.56028895 | 119.094 |
| 11 | −278.472163674 | 0.676827586 | N2 | 1.00000320 | 120.155 |
| 12 | 959.514633579 | 36.082624687 | SIO2HL | 1.56028895 | 118.383 |
| 13 | −896.787607317 | 4.587825747 | N2 | 1.00000320 | 116.762 |
| 14 | 158.750812726 | 85.801121037 | SIO2HL | 1.56028895 | 106.229 |
| 15 | 300.475102689AS | 43.038670535 | N2 | 1.00000320 | 83.117 |
| 16 | −175.884377464A | 6.768275864 | SIO2HL | 1.56028895 | 72.476 |
| 17 | 320.319576676 | 27.446116916 | N2 | 1.00000320 | 68.293 |
| 18 | −146.443321423 | 9.668965520 | SIO2HL | 1.56028895 | 67.974 |
| 19 | 339.454879151 | 28.665475857 | N2 | 1.00000320 | 72.279 |
| 20 | −161.977156970 | 10.635862072 | SIO2HL | 1.56028895 | 73.414 |
| 21 | −238.647909042AS | 15.370621050 | N2 | 1.00000320 | 79.551 |
| 22 | −150.311235300 | 27.766876031 | SIO2HL | 1.56028895 | 81.604 |
| 23 | −155.362800581 | 0.676827586 | N2 | 1.00000320 | 92.928 |
| 24 | −428.765583246 | 34.936111184 | SIO2HL | 1.56028895 | 101.383 |
| 25 | −220.472579824 | 0.676827586 | N2 | 1.00000320 | 108.198 |
| 26 | −438.752339375 | 25.651183289 | SIO2HL | 1.56028895 | 111.993 |
| 27 | −486.537649387 | 16.665277911 | N2 | 1.00000320 | 118.679 |
| 28 | 286.503340486 | 84.567562777 | SIO2HL | 1.56028895 | 136.363 |
| 29 | −370.847311034 | 7.492580442 | N2 | 1.00000320 | 135.394 |
| 30 | −366.945132944AS | 11.602758624 | SIO2HL | 1.56028895 | 132.013 |
| 31 | 577.586771717 | 32.431277232 | N2 | 1.00000320 | 128.108 |
| 32 | −559.674262738 | 11.602758624 | SIO2HL | 1.56028895 | 128.110 |
| 33 | 537.388094819 | 2.743298664 | N2 | 1.00000320 | 131.720 |
| 34 | 408.077824696 | 42.484571757 | SIO2HL | 1.56028895 | 134.394 |
| 35 | −717.357209302 | 0.676827586 | N2 | 1.00000320 | 134.718 |
| 36 | 583.086197224AS | 6.768275864 | SIO2HL | 1.56028895 | 133.965 |
| 37 | 269.271701042 | 7.352686536 | N2 | 1.00000320 | 133.550 |
| 38 | 281.248185100 | 35.203322187 | SIO2HL | 1.56028895 | 136.018 |
| 39 | 472.606393970 | 3.186212988 | N2 | 1.00000320 | 135.918 |
| 40 | 363.576248488 | 54.546183651 | SIO2HL | 1.56028895 | 137.633 |
| 41 | −468.746315410 | 23.108875520 | N2 | 1.00000320 | 137.324 |
| 42 | −251.383937308 | 11.602758624 | SIO2HL | 1.56028895 | 136.437 |
| 43 | −1073.133309030 | 33.841379320 | N2 | 1.00000320 | 140.158 |
| 44 | 0.000000000 | −24.172413800 | N2 | 1.00000320 | 142.969 |
| 45 | 300.919916537 | 63.201252893 | SIO2HL | 1.56028895 | 150.411 |
| 46 | −982.360166014AS | 11.220067842 | N2 | 1.00000320 | 149.618 |
| 47 | −644.040642268AS | 11.602758624 | SIO2HL | 1.56028895 | 148.330 |
| 48 | 251.499390884 | 13.548863209 | N2 | 1.00000320 | 144.384 |
| 49 | 295.116548681 | 83.834389825 | SIO2HL | 1.56028895 | 147.231 |
| 50 | −592.936469041 | 0.676827586 | N2 | 1.00000320 | 147.243 |
| 51 | 463.737108447 | 36.976613477 | SIO2HL | 1.56028895 | 141.167 |
| 52 | −1426.895647680 | 0.695672042 | N2 | 1.00000320 | 139.475 |
| 53 | 140.559527472 | 39.416922789 | SIO2HL | 1.56028895 | 113.157 |
| 54 | 220.743893827 | 0.878083956 | N2 | 1.00000320 | 106.607 |
| 55 | 135.149194981 | 30.341942424 | SIO2HL | 1.56028895 | 96.272 |
| 56 | 227.528619088 | 0.689419669 | N2 | 1.00000320 | 89.300 |
| 57 | 157.276474717 | 26.304510971 | SIO2HL | 1.56028895 | 82.536 |
| 58 | 236.864111032 | 8.994847659 | N2 | 1.00000320 | 70.218 |
| 59 | 366.476934349 | 10.551547532 | SIO2HL | 1.56028895 | 63.779 |
| 60 | 98.334230915 | 0.676870172 | N2 | 1.00000320 | 49.220 |
| 61 | 98.324175829 | 8.007759247 | SIO2HL | 1.56028895 | 48.802 |
| 62 | 76.949074769 | 8.603791096 | N2 | 1.00000320 | 42.525 |
| 63 | 99.077661785 | 24.844220969 | SIO2HL | 1.56028895 | 39.131 |
| 64 | 511.945903814 | 8.702068968 | N2 | 1.00000320 | 26.963 |

TABLE 2-continued

| | | | | | |
|---|---|---|---|---|---|
| 65 | 0.000000000 | 0.000000000 | N2 | 1.00000320 | 14.020 |
| 66 | 0.000000000 | 0.000000000 | | 1.00000000 | 14.020 |

ASPHERIC CONSTANTS

| SURFACE NO. 2 | | SURFACE NO. 4 | | SURFACE NO. 15 | |
|---|---|---|---|---|---|
| C0 | 0.0000 | C0 | 0.0000 | C0 | 0.0000 |
| C1 | 1.28169760e−007 | C1 | 8.23267830e−008 | C1 | −7.43129292e−009 |
| C2 | −7.84396436e−012 | C2 | 2.76986901e−012 | C2 | −2.93262230e−012 |
| C3 | 4.40001122e−016 | C3 | −1.95568740e−016 | C3 | −2.03722650e−016 |
| C4 | −7.79882973e−021 | C4 | −7.24098423e−021 | C4 | −1.22563860e−020 |
| C5 | −1.30623440e−023 | C5 | 1.06376091e−023 | C5 | 5.96520089e−025 |
| C6 | 2.14846923e−027 | C6 | −1.43486056e−027 | C6 | −1.46602552e−028 |
| C7 | −1.41595024e−031 | C7 | 1.06511374e−031 | C7 | 1.53867443e−032 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| SURFACE NO. 16 | | SURFACE NO. 21 | | SURFACE NO. 30 | |
|---|---|---|---|---|---|
| C0 | 0.0000 | C0 | 0.0000 | C0 | 0.0000 |
| C1 | −3.79251645e−008 | C1 | −1.34732963e−008 | C1 | −2.23816289e−009 |
| C2 | 3.22483445e−012 | C2 | 2.75857068e−012 | C2 | 6.79079206e−013 |
| C3 | 1.95986817e−016 | C3 | 1.90481938e−016 | C3 | −2.77226923e−018 |
| C4 | 2.59408631e−020 | C4 | 2.08472207e−020 | C4 | −1.25547219e−022 |
| C5 | −1.79899203e−024 | C5 | −6.19866674e−025 | C5 | −1.58964362e−026 |
| C6 | −1.09069425e−029 | C6 | 2.52896158e−028 | C6 | 6.91621100e−031 |
| C7 | 3.19439367e−033 | C7 | −1.80211827e−032 | C7 | −9.74826154e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| SURFACE NO. 36 | | SURFACE NO. 46 | | SURFACE NO. 47 | |
|---|---|---|---|---|---|
| C0 | 0.0000 | C0 | 0.0000 | C0 | 0.0000 |
| C1 | −1.48722851e−008 | C1 | −1.29322449e−009 | C1 | −6.45902286e−009 |
| C2 | −3.21783489e−013 | C2 | −7.13114740e−014 | C2 | −2.38977080e−014 |
| C3 | −1.94353769e−018 | C3 | −9.86341305e−018 | C3 | −1.08609626e−017 |
| C4 | −1.66369859e−022 | C4 | 7.04573131e−023 | C4 | 2.89713800e−023 |
| C5 | 8.53060454e−028 | C5 | 6.79406884e−027 | C5 | 1.03658811e−026 |
| C6 | −4.40031159e−032 | C6 | −5.13273315e−031 | C6 | −6.18950334e−031 |
| C7 | −1.13839635e−036 | C7 | 8.48667932e−036 | C7 | 1.10366044e−035 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

Figure 4:
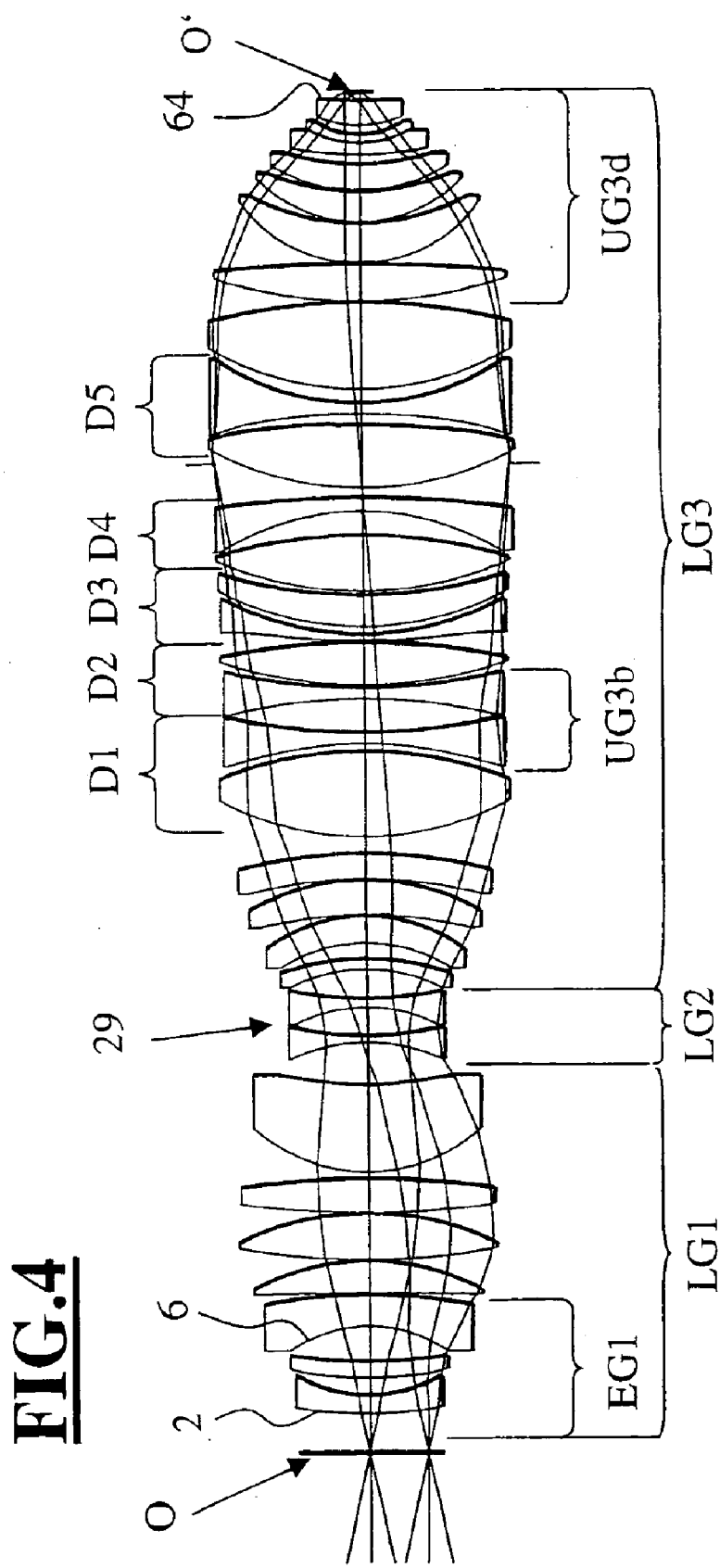
FIG. 4 represents a projection objective with a length of 1390 mm and a numerical aperture of 0.85 designed for a wavelength of 157 nm.

The lens arrangement illustrated in FIG. 4 is designed to work with light of a wavelength of 157 nm (F2 excimer laser). The designed length, measured from the object plane O to the image plane O', is 1390.0 mm. A field of 10.5×26 mm$^2$ can be exposed with this lens arrangement 21. The overall configuration of this lens arrangement differs only in non-essential aspects from the arrangement of FIG. 3, so that a detailed description would be redundant. The specific lens data are listed in Table 3.

TABLE 3

| SURFACE | RADIUS | THICKNESS | MATERIAL | REFR. INDEX 157.6299 nm | ½ FREE DIAMETER |
|---|---|---|---|---|---|
| 0 | 0.000000000 | 25.000000000 | N2 | 1.00031429 | 59.000 |
| 1 | 0.000000000 | 15.339378260 | N2 | 1.00031429 | 64.435 |
| 2 | 598.342471978AS | 18.724519350 | CAF2 | 1.55929035 | 69.077 |
| 3 | 48.181482862 | 16.454829635 | N2 | 1.00031429 | 70.793 |
| 4 | 564.226137144AS | 16.592649095 | CAF2 | 1.55929035 | 73.697 |
| 5 | 465.197188245 | 36.842463522 | N2 | 1.00031429 | 76.403 |
| 6 | −136.836954878 | 30.276088945 | CAF2 | 1.55929035 | 78.647 |
| 7 | −551.745951642 | 1.159089824 | N2 | 1.00031429 | 101.430 |
| 8 | −9088.971563130 | 35.614698676 | CAF2 | 1.55929035 | 108.594 |
| 9 | −226.956823330 | 0.700000000 | N2 | 1.00031429 | 111.475 |
| 10 | 723.679003959 | 46.740300924 | CAF2 | 1.55929035 | 125.059 |
| 11 | −289.614238561 | 0.700000002 | N2 | 1.00031429 | 126.015 |
| 12 | 910.153581387 | 34.209584427 | CAF2 | 1.55929035 | 124.006 |
| 13 | −966.460684234 | 6.344682099 | N2 | .00031429 | 122.517 |
| 14 | 165.167813091 | 88.645251493 | CAF2 | 1.55929035 | 110.777 |
| 15 | 311.690939161AS | 44.560755800 | N2 | 1.00031429 | 86.752 |
| 16 | −181.953058549AS | 7.000000001 | CAF2 | 1.55929035 | 75.717 |
| 17 | 324.246438590 | 28.589730429 | N2 | 1.00031429 | 71.205 |
| 18 | −151.825774985 | 10.000000000 | CAF2 | 1.55929035 | 70.907 |
| 19 | 355.946694253 | 29.718149685 | N2 | 1.00031429 | 75.412 |

TABLE 3-continued

| | | | | | |
|---|---|---|---|---|---|
| 20 | −167.034295485 | 11.000000000 | CAF2 | 1.55929035 | 76.480 |
| 21 | −246.225068997AS | 15.900879213 | N2 | 1.00031429 | 82.882 |
| 22 | −155.088799672 | 28.774591277 | CAF2 | 1.55929035 | 84.935 |
| 23 | −160.065089727 | 0.718056461 | N2 | 1.00031429 | 96.655 |
| 24 | −441.811052729 | 36.169965537 | CAF2 | 1.55929035 | 105.539 |
| 25 | −228.522063652 | 0.700000001 | N2 | 1.00031429 | 112.577 |
| 26 | −454.136397771 | 26.566366602 | CAF2 | 1.55929035 | 116.532 |
| 27 | −500.119500379 | 17.199265008 | N2 | 1.00031429 | 123.439 |
| 28 | 296.713551807 | 87.963677578 | CAF2 | 1.55929035 | 141.803 |
| 29 | −382.314123004 | 7.668609038 | N2 | 1.00031429 | 140.780 |
| 30 | −376.638593815AS | 12.000000000 | CAF2 | 1.55929035 | 137.274 |
| 31 | 607.216067418 | 33.641387962 | N2 | 1.00031429 | 133.150 |
| 32 | −570.164044613 | 12.000000000 | CAF2 | 1.55929035 | 133.141 |
| 33 | 564.533373593 | 2.816684919 | N2 | 1.00031429 | 136.871 |
| 34 | 427.721752683 | 43.902690083 | CAF2 | 1.55929035 | 139.590 |
| 35 | −732.675269060 | 0.700000000 | N2 | 1.00031429 | 139.914 |
| 36 | 602.910545189AS | 7.000000000 | CAF2 | 1.55929035 | 139.079 |
| 37 | 279.908546327 | 7.662016814 | N2 | 1.00031429 | 138.631 |
| 38 | 292.067625915 | 33.982510064 | CAF2 | 1.55929035 | 141.194 |
| 39 | 486.808587823 | 3.734684777 | N2 | 1.00031429 | 141.087 |
| 40 | 374.488854583 | 56.692816434 | CAF2 | 1.55929035 | 142.952 |
| 41 | −487.437697890 | 24.337612976 | N2 | 1.00031429 | 142.631 |
| 42 | −260.866697273 | 12.000000000 | CAF2 | 1.55929035 | 141.625 |
| 43 | −1117.259721160 | 35.000000000 | N2 | 1.00031429 | 145.541 |
| 44 | 0.000000000 | −25.000000000 | N2 | 1.00031429 | 148.094 |
| 45 | 311.002273193 | 65.578230150 | CAF2 | 1.55929035 | 157.034 |
| 46 | −1023.554315350AS | 11.481377894 | N2 | 1.00031429 | 156.356 |
| 47 | −672.576714992AS | 12.000000000 | CAF2 | 1.55929035 | 155.113 |
| 48 | 259.883468261 | 14.205528799 | N2 | 1.00031429 | 151.262 |
| 49 | 305.263739591 | 86.781334194 | CAF2 | 1.55929035 | 154.398 |
| 50 | −617.755257115 | 0.700000000 | N2 | 1.00031429 | 154.565 |
| 51 | 476.256251891 | 38.263167655 | CAF2 | 1.55929035 | 148.491 |
| 52 | −1486.494799770 | 0.719489630 | N2 | 1.00031429 | 147.010 |
| 53 | 145.476122811 | 40.782858325 | CAF2 | 1.55929035 | 119.019 |
| 54 | 229.665054801 | 0.933275871 | N2 | 1.00031429 | 113.051 |
| 55 | 140.220419138 | 31.392645646 | CAF2 | 1.55929035 | 101.740 |
| 56 | 234.824506571 | 0.723640009 | N2 | 1.00031429 | 95.088 |
| 57 | 162.332837065 | 27.214899096 | CAF2 | 1.55929035 | 87.541 |
| 58 | 244.278333665 | 9.299918126 | N2 | 1.00031429 | 74.726 |
| 59 | 376.868342950 | 10.929551626 | CAF2 | 1.55929035 | 67.902 |
| 60 | 101.455739030 | 0.715773254 | N2 | 1.00031429 | 51.847 |
| 61 | 101.162965635 | 8.299519050 | CAF2 | 1.55929035 | 51.361 |
| 62 | 79.437870675 | 8.884307252 | N2 | 1.00031429 | 44.619 |
| 63 | 102.534993850 | 25.750482491 | CAF2 | 1.55929035 | 41.066 |
| 64 | 527.160854703 | 9.000000000 | N2 | 1.00031429 | 28.053 |
| 65 | 0.000000000 | 0.000000000 | N2 | 1.00031429 | 14.750 |
| 66 | 0.000000000 | 0.000000000 | | 1.00000000 | 14.750 |

ASPHERIC CONSTANTS

| SURFACE NO. 2 | | SURFACE NO. 4 | | SURFACE NO. 15 | |
|---|---|---|---|---|---|
| C0 | 0.0000 | C0 | 0.0000 | C0 | 0.0000 |
| C1 | 1.13998854e−007 | C1 | 7.54224753e−008 | C1 | −6.96085201e−009 |
| C2 | −6.36178693e−012 | C2 | 2.18650725e−012 | C2 | −2.46245992e−012 |
| C3 | 3.23659752e−016 | C3 | −1.43119795e−016 | C3 | −1.57870389e−016 |
| C4 | −5.32444727e−021 | C4 | −4.77106422e−021 | C4 | −8.75762750e−021 |
| C5 | −8.32495109e−024 | C5 | 6.81749068e−024 | C5 | 3.86817665e−025 |
| C6 | 1.27324768e−027 | C6 | −8.54589429e−028 | C6 | −9.00885871e−029 |
| C7 | −7.83910573e−032 | C7 | 5.97164385e−032 | C7 | 8.78630596e−033 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| SURFACE NO. 16 | | SURFACE NO. 21 | | SURFACE NO. 30 | |
|---|---|---|---|---|---|
| C0 | 0.0000 | C0 | 0.0000 | C0 | 0.0000 |
| C1 | −3.45865856e−008 | C1 | −1.29712266e−008 | C1 | −2.06288424e−009 |
| C2 | 2.71322951e−012 | C2 | 2.27339781e−012 | C2 | 5.71589058e−013 |
| C3 | 1.50235080e−016 | C3 | 1.44782825e−016 | C3 | −2.21154944e−018 |
| C4 | 1.89751309e−020 | C4 | 1.49868277e−020 | C4 | −8.89810821e−023 |
| C5 | −1.30006219e−024 | C5 | −4.08871955e−025 | C5 | −1.08068385e−026 |
| C6 | 6.16358831e−030 | C6 | 1.55577307e−028 | C6 | 4.36847400e−031 |
| C7 | 1.17159428e−033 | C7 | −1.00785028e−032 | C7 | −5.73712694e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

TABLE 3-continued

| SURFACE NO. 36 | | SURFACE NO. 46 | | SURFACE NO. 47 | |
|---|---|---|---|---|---|
| C0 | 0.0000 | C0 | 0.0000 | C0 | 0.0000 |
| C1 | −1.34482120e−008 | C1 | −1.19258053e−009 | C1 | −5.81614530e−009 |
| C2 | −2.70871166e−013 | C2 | −6.06323614e−014 | C2 | −2.06494325e−014 |
| C3 | −1.46625867e−018 | C3 | −7.79480128e−018 | C3 | −8.58899622e−018 |
| C4 | −1.23067852e−022 | C4 | 5.18508440e−023 | C4 | 2.06606063e−023 |
| C5 | 6.79261614e−028 | C5 | 4.67224846e−027 | C5 | 7.14078196e−027 |
| C6 | −3.16281062e−032 | C6 | −3.31365069e−031 | C6 | −3.99032238e−031 |
| C7 | −5.79252063e−037 | C7 | 5.12625482e−036 | C7 | 6.64567245e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

Figure 5:
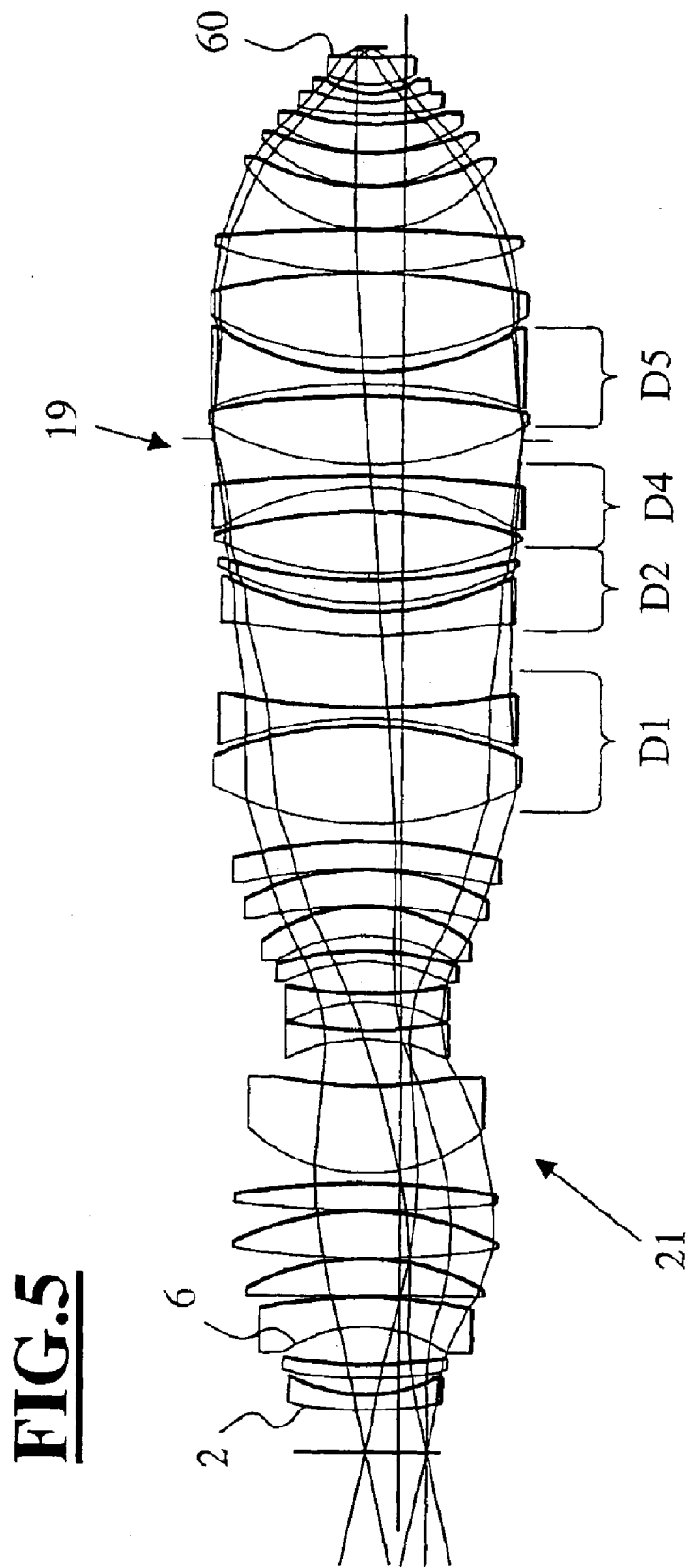
FIG. 5 represents a projection objective with a length of 1300 mm designed for a wavelength of 157 nm.

The lens arrangement 21 shown in FIG. 5 is designed likewise for the wavelength of 157.6 nm. This lens arrangement 21 differs significantly from the preceding examples in that only three doublets, i.e., D1, D2 and D4, are placed ahead of the system diaphragm 19. The doublet that was identified as D3 in the preceding figures has been omitted in the arrangement of FIG. 5. The two consecutive negative lenses that form the second, weakly curved waist are in this case arranged at a distance from each other. As a result of the modified arrangement and the omission of the doublet D3, the lens volume of the objective is reduced, which has the benefits of a lower material cost and a reduced level of absorption. The specific lens data are listed in the following Table 4.

TABLE 4

| SURFACE | RADIUS | THICKNESS | MATERIAL | REFR. INDEX 157.6299 nm | ½ FREE DIAMETER |
|---|---|---|---|---|---|
| 0 | 0.000000000 | 23.762838750 | N2 | 1.00031429 | 56.080 |
| 1 | 0.000000000 | 14.246137526 | N2 | 1.00031429 | 61.246 |
| 2 | 514.707276562AS | 13.981815236 | CAF2 | 1.55929035 | 65.688 |
| 3 | 138.212721202 | 15.579876293 | N2 | 1.00031429 | 66.951 |
| 4 | 534.824781243AS | 12.739496641 | CAF2 | 1.55929035 | 69.622 |
| 5 | 389.864179126 | 33.913726677 | N2 | 1.00031429 | 71.684 |
| 6 | −131.473719619 | 28.107831970 | CAF2 | 1.55929035 | 73.586 |
| 7 | −471.981433648 | 1.069906657 | N2 | 1.00031429 | 93.899 |
| 8 | 0.000000000 | 34.308184523 | CAF2 | 1.55929035 | 101.225 |
| 9 | −228.280123150 | 0.704684075 | N2 | 1.00031429 | 104.724 |
| 10 | 796.724829345 | 43.758159816 | CAF2 | 1.55929035 | 116.173 |
| 11 | −266.360318650 | 0.745094303 | N2 | 1.00031429 | 117.347 |
| 12 | 1081.261439844 | 23.811542913 | CAF2 | 1.55929035 | 115.969 |
| 13 | −712.390784368 | 9.916731254 | N2 | 1.00031429 | 115.443 |
| 14 | 158.258040233 | 80.929657183 | CAF2 | 1.55929035 | 103.893 |
| 15 | 328.916333526AS | 43.637981348 | N2 | 1.00031429 | 83.021 |
| 16 | −163.783184213AS | 8.000000000 | CAF2 | 1.55929035 | 71.477 |
| 17 | 294.432712383 | 27.405950067 | N2 | 1.00031429 | 67.256 |
| 18 | −144.330554051 | 8.234758928 | CAF2 | 1.55929035 | 67.032 |
| 19 | 397.835892386 | 28.266532844 | N2 | 1.00031429 | 71.373 |
| 20 | −161.553948900 | 10.395325272 | CAF2 | 1.55929035 | 72.890 |
| 21 | −258.614401773AS | 15.068965479 | N2 | 1.00031429 | 79.201 |
| 22 | −148.191144865 | 27.281969779 | CAF2 | 1.55929035 | 80.726 |
| 23 | −153.092043553 | 0.711404699 | N2 | 1.00031429 | 91.935 |
| 24 | −429.848987135 | 34.313214826 | CAF2 | 1.55929035 | 100.580 |
| 25 | −222.509319222 | 0.755186371 | N2 | 1.00031429 | 107.422 |
| 26 | −446.042338354 | 25.134410060 | CAF2 | 1.55929035 | 111.325 |
| 27 | −476.016743713 | 16.168036298 | N2 | 1.00031429 | 117.862 |
| 26 | 290.945720195 | 91.150270987 | CAF2 | 1.55929035 | 135.561 |
| 29 | −352.999009021 | 7.239891532 | N2 | 1.00031429 | 134.606 |
| 30 | −333.990335846AS | 10.794904282 | CAF2 | 1.55929035 | 131.837 |
| 31 | 686.418617658 | 67.606049576 | N2 | 1.00031429 | 128.953 |
| 32 | 484.704981071AS | 20.247999550 | CAF2 | 1.55929035 | 129.812 |
| 33 | 272.256910966 | 8.301324639 | N2 | 1.00031429 | 129.690 |
| 34 | 283.424612963 | 21.444612905 | CAF2 | 1.55929035 | 132.593 |
| 35 | 441.096441131 | 7.286378331 | N2 | 1.00031429 | 132.611 |
| 36 | 341.080821148 | 56.120769051 | CAF2 | 1.55929035 | 135.413 |
| 37 | −467.022730717 | 23.483002796 | N2 | 1.00031429 | 135.092 |
| 38 | −251.271987182 | 10.033317804 | CAF2 | 1.55929035 | 133.934 |
| 39 | −1127.860216547 | 34.039044392 | N2 | 1.00031429 | 137.435 |
| 40 | 0.000000000 | −23.762838750 | N2 | 1.00031429 | 140.287 |
| 41 | 297.718439650 | 63.279096400 | CAF2 | 1.55929035 | 148.476 |
| 42 | −917.492707769AS | 10.913617063 | N2 | 1.00031429 | 147.745 |
| 43 | −614.308568323AS | 11.278985347 | CAF2 | 1.55929035 | 146.599 |
| 44 | 248.499662987 | 14.012163218 | N2 | 1.00031429 | 143.454 |
| 45 | 293.420324051 | 77.421679876 | CAF2 | 1.55929035 | 146.721 |
| 46 | −577.615924152 | 0.827697065 | N2 | 1.00031429 | 146.976 |
| 47 | 428.803478030 | 38.627735627 | CAF2 | 1.55929035 | 141.309 |

TABLE 4-continued

| | | | | | |
|---|---|---|---|---|---|
| 48 | −1538.689777020 | 0.709093944 | N2 | 1.00031429 | 539.590 |
| 49 | 138.430254604 | 39.259717130 | CAF2 | 1.55929035 | 113.344 |
| 50 | 220.629434605 | 0.852226738 | N2 | 1.00031429 | 107.642 |
| 51 | 134.960023432 | 29.998458517 | CAF2 | 1.55929035 | 97.026 |
| 52 | 215.500125113 | 0.702119104 | N2 | 1.00031429 | 89.828 |
| 53 | 149.475551465 | 25.893987130 | CAF2 | 1.55929035 | 82.702 |
| 54 | 231.671140781 | 8.806791935 | N2 | 1.00031429 | 71.084 |
| 55 | 350.283305716 | 10.400580673 | CAF2 | 1.55929035 | 64.558 |
| 56 | 145.109553410 | 0.700000000 | N2 | 1.00031429 | 52.531 |
| 57 | 141.455177019 | 8.001279379 | CAF2 | 1.55929035 | 51.711 |
| 58 | 73.955966022 | 8.329441414 | N2 | 1.00031429 | 42.090 |
| 59 | 96.168359436 | 24.494556608 | CAF2 | 1.55929035 | 38.879 |
| 60 | 459.800275735 | 8.554621950 | N2 | 1.00031429 | 26.571 |
| 61 | 0.000000000 | | N2 | | 14.020 |

ASPHERIC CONSTANTS

| SURFACE NO. 2 | | SURFACE NO. 4 | | SURFACE NO. 15 | |
|---|---|---|---|---|---|
| C0 | 0.0000 | C0 | 0.0000 | C0 | 0.0000 |
| C1 | 1.40076890e−007 | C1 | 9.46620092e−008 | C1 | −1.23543806e−008 |
| C2 | −9.37770559e−012 | C2 | 3.31455802e−012 | C2 | −3.08782621e−012 |
| C3 | 5.50812946e−016 | C3 | −2.39290707e−016 | C3 | −2.03630284e−016 |
| C4 | 6.20589318e−021 | C4 | −1.71234783e−020 | C4 | −8.16153110e−021 |
| C5 | −2.37140019e−023 | C5 | 1.74026756e−023 | C5 | 1.74407091e−025 |
| C6 | 3.95180787e−027 | C6 | −2.43020107e−027 | C6 | −5.09307070e−029 |
| C7 | −2.60792832e−031 | C7 | 1.77431459e−031 | C7 | 1.00885745e−032 |
| C8 | 0.00000000e+000 | C8 | 0.00000000e+000 | CB | 0.00000000e+000 |
| C9 | 0.00000000e+000 | C9 | 0.00000000e+000 | C9 | 0.00000000e+000 |

| SURFACE NO. 16 | | SURFACE NO. 21 | | SURFACE NO. 30 | |
|---|---|---|---|---|---|
| C0 | 0.0000 | C0 | 0.0000 | C0 | 0.0000 |
| C1 | −4.62416977e−008 | C1 | −2.13181934e−008 | C1 | −2.44196650e−009 |
| C2 | 5.09342413e−012 | C2 | 3.39572804e−012 | C2 | 6.83785083e−013 |
| C3 | 1.93873865e−016 | C3 | 1.70428863e−016 | C3 | −4.77483094e−018 |
| C4 | 2.75889868e−020 | C4 | 2.27977453e−020 | C4 | −4.35836087e−023 |
| C5 | −1.64807233e−024 | C5 | −9.47218587e−025 | C5 | −1.74046992e−026 |
| C6 | −1.89286552e−028 | C6 | 2.65529506e−028 | C6 | 6.83065300e−031 |
| C7 | 1.58124115e−032 | C7 | −2.14888777e−032 | C7 | −9.01251572e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| SURFACE NO. 32 | | SURFACE NO. 42 | | SURFACE NO. 43 | |
|---|---|---|---|---|---|
| C0 | 0.0000 | C0 | 0.0000 | C0 | 0.0000 |
| C1 | −1.53715814e−008 | C1 | −1.38703825e−009 | C1 | −6.81804423e−009 |
| C2 | −3.53812954e−013 | C2 | −7.42014625e−014 | C2 | −3.12076075e−014 |
| C3 | −8.52862214e−019 | C3 | −1.11669633e−017 | C3 | −1.22481799e−017 |
| C4 | −2.84552357e−022 | C4 | 7.72614773e−023 | C4 | 2.99026626e−023 |
| C5 | 3.34667441e−027 | C5 | 8.16034068e−027 | C5 | 1.23468742e−026 |
| C6 | −1.70981346e−031 | C6 | −6.36127613e−031 | C6 | −7.60144642e−031 |
| C7 | 8.06815620e−038 | C7 | 1.09104108e−035 | C7 | 1.42018134e−035 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

Figure 6:
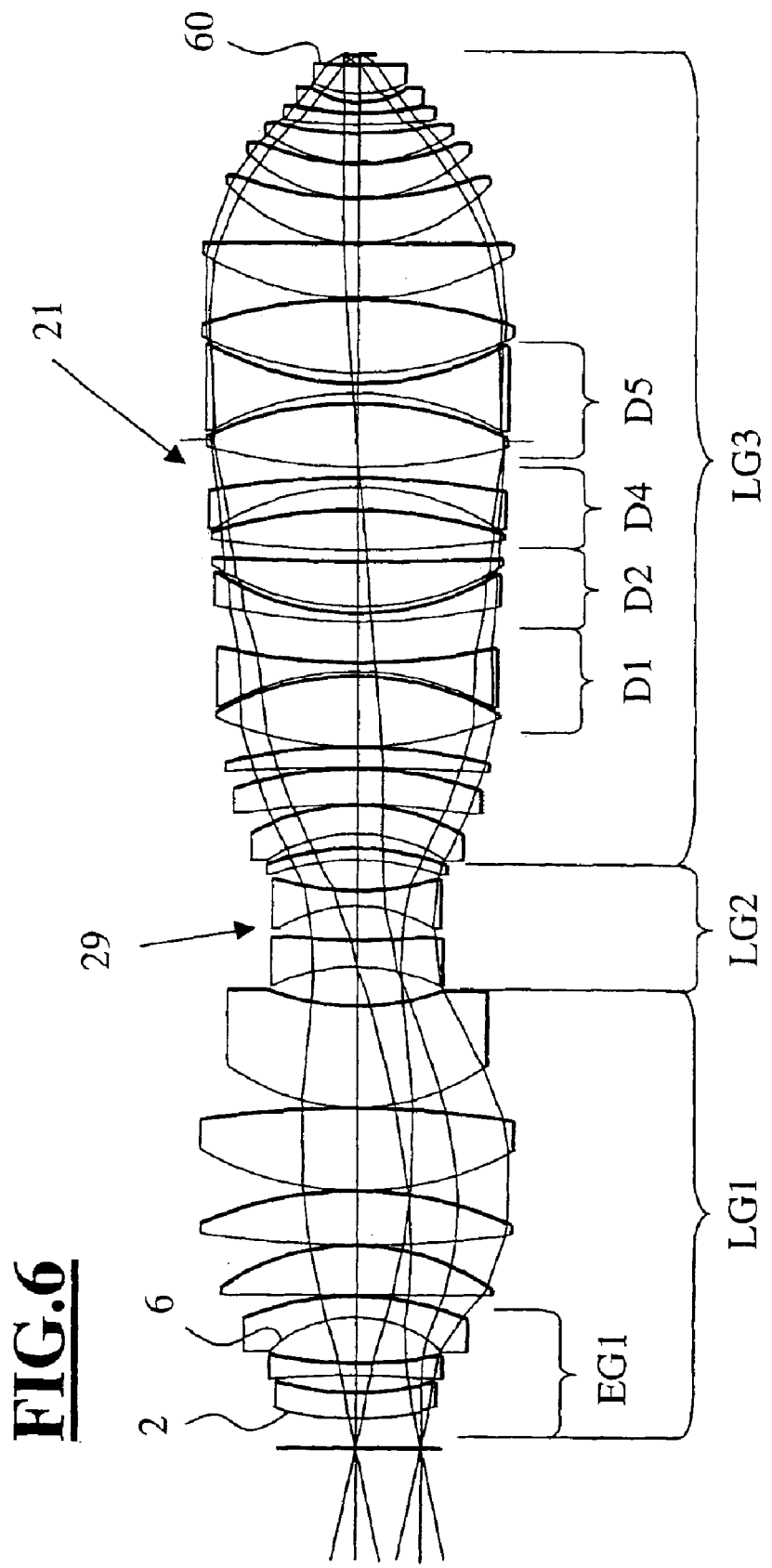
FIG. 6 represents a projection objective with a length of 1200 mm designed for a wavelength of 193 nm.

The lens arrangement 21 shown in FIG. 6 is designed for the wavelength of 193 nanometers. The size of the exposure field is 10.5×26 mm². The design length measured from the object plane O to the image plane O' is 1200 mm. An amount of only 103 kg of quartz glass material is required for manufacturing this objective. Analogous to the example of FIG. 5, this embodiment again has a total of only four doublets. The doublet that was identified as D3 in FIGS. 2–4 has again been omitted in the arrangement of FIG. 6. The detailed lens data are listed in Table 5.

TABLE 5

| SURFACE | RADIUS | THICKNESS | MATERIAL | REFR. INDEX 193.304 nm | ½ FREE DIAMETER |
|---|---|---|---|---|---|
| 0 | 0.000000000 | 22.812325200 | N2 | 1.00000320 | 56.080 |
| 1 | 0.000000000 | 10.339145912 | N2 | 1.00000320 | 61.040 |
| 2 | 1344.886802290AS | 15.881971169 | SIO2HL | 1.56028895 | 63.970 |
| 3 | 232.178777938 | 15.628670502 | N2 | 1.00000320 | 66.074 |
| 4 | −537.599235732AS | 10.251256144 | SIO2HL | 1.56028895 | 67.146 |
| 5 | 357.600737011 | 39.221339825 | N2 | 1.00000320 | 71.765 |
| 6 | −107.956923549 | 18.404856395 | SIO2HL | 1.56028895 | 73.446 |

TABLE 5-continued

| | | | | | |
|---|---|---|---|---|---|
| 7 | −243.717356229 | 0.700350683 | N2 | 1.00000320 | 92.692 |
| 8 | 0.000000000 | 41.961272197 | SIO2HL | 1.56028895 | 108.723 |
| 9 | −202.822623296 | 0.701099003 | N2 | 1.00000320 | 112.352 |
| 10 | 908.396780928 | 46.105755859 | SIO2HL | 1.56028895 | 127.495 |
| 11 | −324.403526021 | 0.700000000 | N2 | 1.00000320 | 129.122 |
| 12 | 272.374319621 | 70.961916034 | SIO2HL | 1.56028895 | 129.626 |
| 13 | −861.339949580 | 0.801352132 | N2 | 1.00000320 | 124.293 |
| 14 | 189.599720148 | 87.814706985 | SIO2HL | 1.56028895 | 107.193 |
| 15 | 235.651582170AS | 33.939348010 | N2 | 1.00000320 | 73.553 |
| 16 | −167.950781585 | 23.127229402 | SIO2HL | 1.56028895 | 71.043 |
| 17 | 418.275060837AS | 29.676213557 | N2 | 1.00000320 | 66.843 |
| 18 | −122.074492458 | 12.991654582 | SIO2HL | 1.56028895 | 65.012 |
| 19 | 225.914585773 | 27.597144000 | N2 | 1.00000320 | 69.278 |
| 20 | −207.944504375 | 9.625251661 | SIO2HL | 1.56028895 | 70.891 |
| 21 | −222.237071915AS | 12.259114879 | N2 | 1.00000320 | 74.459 |
| 22 | −143.306961785 | 25.742020969 | SIO2HL | 1.56028895 | 75.779 |
| 23 | −171.350364563 | 0.700000000 | N2 | 1.00000320 | 87.359 |
| 24 | −584.950465544 | 30.430256525 | SIO2HL | 1.56028895 | 94.810 |
| 25 | −322.926323860 | 0.700000000 | N2 | 1.00000320 | 102.056 |
| 26 | −2074.519592980 | 18.436325366 | SIO2HL | 1.56028895 | 106.932 |
| 27 | −454.899324547 | 0.700000000 | N2 | 1.00000320 | 108.765 |
| 28 | 311.973161398 | 60.379264795 | SIO2HL | 1.56028895 | 116.799 |
| 29 | −244.157709436 | 4.226375511 | N2 | 1.00000320 | 116.691 |
| 30 | −226.802865587AS | 8.000000000 | SIO2HL | 1.56028895 | 115.226 |
| 31 | 581.003793889AS | 33.843695716 | N2 | 1.00000320 | 113.965 |
| 32 | 433.165006354AS | 8.000000000 | SIO2HL | 1.56028895 | 117.646 |
| 33 | 220.638014434 | 6.160147896 | N2 | 1.00000320 | 117.478 |
| 34 | 235.847612538 | 38.094085109 | SIO2HL | 1.56028895 | 119.548 |
| 35 | 2922.562377140 | 10.091385703 | N2 | 1.00000320 | 119.635 |
| 36 | 828.603251335 | 34.242333007 | SIO2HL | 1.56028895 | 120.292 |
| 37 | −421.523524573 | 19.499093440 | N2 | 1.00000320 | 120.075 |
| 38 | −227.399216829 | 8.000000000 | SIO2HL | 1.56028895 | 119.391 |
| 39 | −713.133778093 | 32.677482617 | N2 | 1.00000320 | 122.273 |
| 40 | 0.000000000 | −22.812325200 | N2 | 1.00000320 | 124.721 |
| 41 | 477.077275979 | 54.887245264 | SIO2HL | 1.56028895 | 128.109 |
| 42 | −302.959408554AS | 9.015123458 | N2 | 1.00000320 | 128.235 |
| 43 | −259.248633314AS | 8.000000000 | SIO2HL | 1.56028895 | 127.331 |
| 44 | 257.367927097 | 9.018964995 | N2 | 1.00000320 | 132.095 |
| 45 | 301.442153248 | 62.427272391 | SIO2HL | 1.56028895 | 134.626 |
| 46 | −415.709868667 | 0.700000000 | N2 | 1.00000320 | 135.476 |
| 47 | 247.440229366AS | 47.657128386 | SIO2HL | 1.56028895 | 133.887 |
| 48 | −288949.445195000 | 0.700000000 | N2 | 1.00000320 | 131.978 |
| 49 | 151.825283163 | 37.348129556 | SIO2HL | 1.56028895 | 112.363 |
| 50 | 293.987758399 | 0.700000000 | N2 | 1.00000320 | 107.532 |
| 51 | 140.326981621 | 28.581518950 | SIO2HL | 1.56028895 | 94.765 |
| 52 | 219.719357959 | 0.700000000 | N2 | 1.00000320 | 86.981 |
| 53 | 142.826791834 | 24.808199570 | SIO2HL | 1.56028895 | 79.406 |
| 54 | 283.110177788 | 7.914740800 | N2 | 1.00000320 | 70.515 |
| 55 | 510.756323891 | 9.591341155 | SIO2HL | 1.56028895 | 64.645 |
| 56 | 266.825722219 | 0.722333492 | N2 | 1.00000320 | 55.512 |
| 57 | 215.942664188 | 8.000000000 | SIO2HL | 1.56028895 | 53.165 |
| 58 | 72.787640467 | 7.718712927 | N2 | 1.00000320 | 41.272 |
| 59 | 93.765259707 | 24.684737028 | SIO2HL | 1.56028895 | 38.377 |
| 60 | 469.355888001 | 8.212437072 | N2 | 1.00000320 | 26.099 |
| 61 | 0.000000000 | 0.000000000 | N2 | 1.00000320 | 14.020 |
| 62 | 0.000000000 | 0.000000000 | | 1.00000000 | 14.020 |

ASPHERIC CONSTANTS

| SURFACE NO. 2 | | SURFACE NO. 4 | | SURFACE NO. 15 | |
|---|---|---|---|---|---|
| C0 | 0.0000 | C0 | 0.0000 | C0 | 0.0000 |
| C1 | 1.52757338e−007 | C1 | 4.00562871e−008 | C1 | 5.47524591e−008 |
| C2 | −1.39394902e−011 | C2 | 4.60196624e−012 | C2 | 5.05793043e−013 |
| C3 | 7.41376692e−016 | C3 | −3.47640954e−016 | C3 | 3.05008775e−017 |
| C4 | −3.46945761e−019 | C4 | 1.69507580e−021 | C4 | 1.98253574e−021 |
| C5 | 8.95992656e−023 | C5 | −3.89922208e−023 | C5 | 7.84443491e−025 |
| C6 | −1.64136955e−026 | C6 | 7.79027536e−027 | C6 | 1.27239733e−028 |
| C7 | 1.18641735e−030 | C7 | −5.53241761e−031 | C7 | 6.73733553e−033 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| SURFACE NO. 17 | | SURFACE NO. 21 | | SURFACE NO. 30 | |
|---|---|---|---|---|---|
| C0 | 0.0000 | C0 | 0.0000 | C0 | 0.0000 |
| C1 | −9.99718876e−008 | C1 | −1.77390890e−008 | C1 | −2.92222111e−009 |
| C2 | −8.52059462e−012 | C2 | 1.86160395e−012 | C2 | 6.98720386e−013 |
| C3 | −5.86845398e−016 | C3 | 2.57697930e−016 | C3 | 9.60282132e−018 |
| C4 | −6.64124324e−020 | C4 | 2.73779514e−020 | C4 | 4.51192034e−022 |

TABLE 5-continued

| | SURFACE NO. 22 | | SURFACE NO. 26 | | SURFACE NO. 29 |
|---|---|---|---|---|---|
| C5 | −4.60657771e−024 | C5 | 4.36917581e−024 | C5 | −8.63764902e−026 |
| C6 | −5.51712065e−028 | C6 | −1.21030389e−028 | C6 | 2.79307913e−030 |
| C7 | 0.00000000e+000 | C7 | 7.05508252e−032 | C7 | −4.28143587e−035 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| | SURFACE NO. 31 | | SURFACE NO. 32 | | SURFACE NO. 42 |
|---|---|---|---|---|---|
| C0 | 0.0000 | C0 | 0.0000 | C0 | 0.0000 |
| C1 | 3.79088573e−009 | C1 | −1.43835369e−008 | C1 | −1.46322720e−009 |
| C2 | 1.54225743e−013 | C2 | 9.53138635e−014 | C2 | −7.32982723e−014 |
| C3 | 2.58122902e−018 | C3 | −7.72742465e−019 | C3 | −4.12559846e−018 |
| C4 | 7.06529922e−022 | C4 | −5.55446815e−023 | C4 | 1.10568402e−022 |
| C5 | −4.65550297e−026 | C5 | 1.85136302e−026 | C5 | 8.54286956e−027 |
| C6 | 1.02837481e−030 | C6 | −1.44110574e−030 | C6 | −8.34588063e−031 |
| C7 | 2.54076903e−036 | C7 | 3.72591227e−035 | C7 | 1.97309537e−035 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| | SURFACE NO. 43 | | SURFACE NO. 47 |
|---|---|---|---|
| C0 | 0.0000 | C0 | 0.0000 |
| C1 | −6.88182408e−009 | C1 | 1.62217387e−009 |
| C2 | 1.49845458e−014 | C2 | −6.74169300e−014 |
| C3 | −3.68264031e−018 | C3 | 1.20108340e−018 |
| C4 | 1.78132275e−022 | C4 | 1.21664354e−023 |
| C5 | 6.62312346e−027 | C5 | −1.11444071e−027 |
| C6 | −8.68541514e−031 | C6 | 1.08479154e−031 |
| C7 | 2.32817966e−035 | C7 | −2.93513997e−036 |
| C8 | 0.00000000e+000 | C8 | 0.00000000e+000 |
| C9 | 0.00000000e+000 | C9 | 0.00000000e+000 |

The aspheric lens surfaces in all of the foregoing examples are obtained by inserting the tabulated values for $C_0$, $C_1$, $C_2$, . . . into the equation $$P(h) = \frac{h^2/R}{1+\sqrt{1-(1+C_0)\frac{h^2}{R^2}}} + C_1 h^4 + C_2 h^6 + \ldots$$

wherein P(h) represents the axial coordinate and h represents the radial coordinate of a point on the lens surface, i.e., P(h) indicates the distance of a point of the lens surface from a plane that contains the vertex of the lens surface and extends perpendicular to the optical axis. $C_1$ to $C_n$ are the aspherical constants listed in the tables, and the constant $C_0$ represents the conicity of the lens surface. R stands for the sagittal radius listed in the tables. The representation according to the foregoing equation with polynomial coefficients $C_1$ to $C_n$ conforms to an industry standard known as CODE V™ and developed by Optical Research Associates, Pasadena, Calif.

Concerning the question of how big a loss in exposure contrast the photoresist can tolerate, it has been found that the contrast loss is significantly influenced by the longitudinal chromatic aberration of a lithography objective. In order to determine the bandwidth of a system for different apertures, wavelengths, materials and structure widths, it is proposed that the diameter of the circle of confusion induced by the longitudinal chromatic aberration be kept smaller than a factor of 2.2 times the structure width, and preferably even smaller than 2.0 times the structure width.

The chromatically induced circle of confusion is to be determined at the maximum aperture and for a deviation $\Delta\lambda$ from the working wavelength by one-half the bandwidth of the light source.

In the following Table 6, the bandwidth of a system was determined for a case where the diameter of the chromatic circle of confusion was equal to 2.1 times the structure width. In comparison to a monochromatic system the resulting contrast loss in grid structures is about 6.5% with the polychromatic system.

TABLE 6

| Embodiment | λ in nm | NA | Image field mm² | Structure width [nm] $K_1 = 0.32$ | Bandwidth pm | Material | CHL nm/pm | Number of aspheres | KCHL |
|---|---|---|---|---|---|---|---|---|---|
| Table 1 | 193 | 0.8 | 26 × 10.5 | 77.3 | 0.31 | SiO | 392 | 9 | 5.02 |
| Table 2 | 193 | 0.85 | 26 × 10.5 | 72.8 | 0.24 | SiO₂ | 401 | 9 | 5.13 |
| Table 3 | 157 | 0.85 | 26 × 14 | 59.3 | 0.12 | CaF₂ | 672 | 9 | 5.18 |
| Table 4 | 157 | 0.85 | 26 × 10.5 | 59.3 | 0.12 | CaF₂ | 668 | 9 | 5.15 |
| Table 5 | 193 | 0.85 | 26 × 10.5 | 72.8 | 0.26 | SiO₂ | 367 | 11 | 4.71 |
| A* | 248 | 0.83 | 26 × 8 | 95.8 | 0.75 | SiO₂ | 180 | 4 | 6.07 |
| B* | 193 | 0.85 | 26 × 8 | 72.8 | 0.19 | SiO₂ | 503 | 11 | 6.64 |

*A and B represent the respective embodiments of Table 2 and Table 4 of WO 01/50171 A1.

The structure width was determined according to the formula:

$$\text{Structure width} = \frac{\lambda * K_1}{NA},$$

wherein a value of 0.32 was selected for $K_1$. A practical range of variation for $K_1$ is between 0.27 and 0.35. The characteristic index KCHL can provide a comparison between the different designs of refractive lithography objectives with regard to the longitudinal chromatic aberration that occurs with the defined image field dimensions, light source band widths, and dispersion of the materials used in the lenses. If the objective consists of only one material, the dispersion of that single material is used. If the objective consists of a plurality of different materials, each lens is assigned a synthesized substitute material with the same refractive index as the actual material of that lens, but with a selected uniform dispersion for the calculation of the substitute longitudinal chromatic aberration.

$$KCHL = \frac{CHL \ [nm]}{\Delta\lambda \ [nm] * \left(\frac{\Delta n}{n-1}\right) * y'\text{max} \ [nm]},$$

wherein
CHL represents the longitudinal chromatic aberration,
$\Delta\lambda$ represents the bandwidth interval, and
Y'max represents the maximum image field diameter.

It is advantageous to enter the values for CHL, $\Delta\lambda$, Y'max in nm in the foregoing equation, choosing for example a value of 1 nm for $\Delta\lambda$. To document the state of the art, the examples A and B of, respectively, Table 4 and Table 2 of WO 01/50171 A1 are shown above in Table 6. Embodiment B has a highly typical KCHL-value of 6.07. Conventional refractive lithography objectives generally vary only within narrow limits from this amount, with the very high KCHL-value of 6.64 in embodiment A representing an exception.

KCHL-values falling significantly below 6.0 have been achieved for the first time with the embodiments presented herein. A particularly low KCHL-value of 4.71 was attained in the example of Table 5. This opens up the unprecedented possibility of using only quartz glass (fused silica, $SiO_2$) as lens material for a wavelength of 193 nm and a structure width of about 70 nm. The ability to completely eliminate the need for $CaF_2$ in an objective for 70 nm structures and to reduce the $CaF_2$ volume for structures smaller than 70 nm represents an enormous economic advantage. The objectives of the design proposed herein have a KCHL-value of less than 5.3, with a preference for KCHL-values below 5.0, and the strongest preference for KCHL-values below 4.8.

LIST OF REFERENCE SYMBOLS

To the extent that the reference symbols indicate analogous elements, they are shared between the different drawing figures.
1 Projection system for photographic exposures
3 Illumination device
5 Projection objective
7 Optical axis
9 Mask
11 Mask holder
13 Image plane
15 Wafer
17 Substrate holder
19 System diaphragm
21 Lens arrangement
23 Light bundle
25 Maximum diameter of light bundle
27 Light bundle diameter
29 First waist

What is claimed is:

1. A refractive projection objective for use in microlithography, comprising a lens arrangement with a system diaphragm, wherein the lens arrangement consists of lenses made exclusively of one and the same material, wherein the objective has an optical axis, an object field, an image field, and an image-side numerical aperture larger than 0.7, wherein a light bundle propagating through the objective is defined by said image field and said image-side numerical aperture and has within the objective a variable light-bundle diameter smaller than or equal to a maximum light-bundle diameter, and wherein in a length interval measured on the optical axis from the system diaphragm towards the object field and at least equaling said maximum light-bundle diameter, said variable light-bundle diameter exceeds 85% of said maximum light-bundle diameter.

2. The objective of claim 1, comprising a first waist arranged between two bulges and further comprising at least four doublets following said first waist relative to a direction of light propagation, each doublet consisting of a negative lens and a positive lens.

3. The objective of claim 2, comprising a second waist formed of two consecutive negative lenses arranged between two positive lenses, wherein each of said positive lenses has a convex lens surface facing towards said negative lenses.

4. The objective of claim 3, wherein the light-bundle diameter in the second waist exceeds 85% of the maximum light-bundle diameter.

5. The objective of claim 2, wherein in each of said doublets the negative lens immediately follows the positive lens relative to said direction of light propagation.

6. The objective of claim 2, wherein each of said doublets has a respective average lens diameter between the positive lens and the negative lens of said doublet, and wherein mutually facing lens surfaces of the positive lens and the negative lens of each of said doublets are spaced from each other at a distance shorter than 10% of said respective average lens diameter.

7. The objective of claim 2, wherein in at least three of said doublets said positive lens and said negative lens have mutually facing lens surfaces spaced less than 10 mm from each other.

8. The objective of claim 1, wherein the first two of the lenses relative to a direction of light propagation have a negative refractive power and are curved towards said object field.

9. The objective of claim 2, wherein the first waist consists of three negative lenses.

10. The objective of claim 1, wherein the first three of the lenses relative to a direction of light propagation have a negative refractive power.

11. A microlithography projection system comprising the objective of claim 1.

12. A method of manufacturing a component comprising a microstructure on a substrate, with the steps of:
applying a light-sensitive coating to the substrate;
exposing the light-sensitive coating to ultraviolet laser light by means of a projection system and a mask of the microstructure; and
developing the light-sensitive coating, whereby the microstructure is formed on the substrate;
wherein the projection system comprises the objective of claim 1.

13. A refractive projection objective for use in microlithography, comprising a lens arrangement with a system diaphragm, wherein the lens arrangement consists of lenses made exclusively of one and the same material, wherein each of the lenses has a diameter less than or equal to a maximum lens diameter, wherein the objective has an optical axis, an object field, an image field, and an image-side numerical aperture larger than 0.7, wherein a light bundle propagating through the objective is defined by said image field and said image-side numerical aperture and has within the objective a variable light-bundle diameter, and wherein in a length interval measured on the optical axis from the system diaphragm towards the object field and at least equaling said maximum lens diameter, said variable light-bundle diameter exceeds 85% of said maximum lens diameter.

14. The objective of claim 13, comprising a first waist arranged between two bulges and further comprising at least four doublets following said first waist relative to a direction of light propagation, each doublet consisting of a negative lens and a positive lens.

15. The objective of claim 14, comprising a second waist formed of two consecutive negative lenses arranged between two positive lenses, wherein each of said positive lenses has a convex lens surface facing towards said negative lenses.

16. The objective of claim 15, wherein the light-bundle diameter in the second waist exceeds 85% of the maximum light-bundle diameter.

17. The objective of claim 14, wherein in each of said doublets the negative lens immediately follows the positive lens relative to said direction of light propagation.

18. The objective of claim 14, wherein each of said doublets has a respective average lens diameter between the positive lens and the negative lens of said doublet, and wherein mutually facing lens surfaces of the positive lens and the negative lens of each of said doublets are spaced from each other at a distance shorter than 10% of said respective average lens diameter.

19. The objective of claim 14, wherein in at least three of said doublets said positive lens and said negative lens have mutually facing lens surfaces spaced less than 10 mm from each other.

20. The objective of claim 13, wherein the first two of the lenses relative to a direction of light propagation have a negative refractive power and are curved towards said object field.

21. The objective of claim 14, wherein the first waist consists of three negative lenses.

22. The objective of claim 13, wherein the first three of the lenses relative to a direction of light propagation have a negative refractive power.

23. A microlithography projection system comprising the objective of claim 13.

24. A method of manufacturing a component comprising a microstructure on a substrate, with the steps of:
  applying a light-sensitive coating to the substrate;
  exposing the light-sensitive coating to ultraviolet laser light by means of a projection system and a mask of the microstructure; and
  developing the light-sensitive coating, whereby the microstructure is formed on the substrate;
wherein the projection system comprises the objective of claim 13.

25. A refractive projection objective for use in microlithography, comprising a lens arrangement that consists of lenses made exclusively of one and the same material, wherein said objective has a numerical aperture of at least 0.8 and is configured for light of a wavelength shorter than 300 nm within a defined bandwidth of $\Delta\lambda$, and wherein the objective is characterized by a characteristic index KCHL defined as $$KCHL = \frac{CHL \; [nm]}{\Delta\lambda \; [nm] * \left(\frac{\Delta n}{n-1}\right) * y'max \; [nm]},$$

wherein
CHL represents a longitudinal chromatic aberration and Y' max represents a maximum image field diameter of the objective, and wherein the characteristic index KCHL is less than or equal to 5.5.

26. The objective of claim 25, wherein the characteristic index KCHL is less than or equal to 5.0.

27. The objective of claim 26, wherein the characteristic index KCHL is less than or equal to 4.8.

28. A microlithography projection system comprising the objective of claim 25.

29. A method of manufacturing a component comprising a microstructure on a substrate, with the steps of:
  applying a light-sensitive coating to the substrate;
  exposing the light-sensitive coating to ultraviolet laser light by means of a projection system and a mask of the microstructure; and
  developing the light-sensitive coating, whereby the microstructure is formed on the substrate;
wherein the projection system comprises the objective of claim 25.

30. A refractive projection objective for use in microlithography, comprising a lens arrangement with a system diaphragm, wherein the lens arrangement is subdivided into three lens groups with a first lens group of positive refractive power forming a first bulge, followed by a second lens group of negative refractive power forming a waist, followed by a third lens group having an elongated configuration taking up 60% of a length measured from the object field to the image field, and wherein the system diaphragm is arranged in the third lens group.

31. A microlithography projection system comprising the objective of claim 30.

32. A method of manufacturing a component comprising a microstructure on a substrate, with the steps of:
  applying a light-sensitive coating to the substrate;
  exposing the light-sensitive coating to ultraviolet laser light by means of a projection system and a mask of the microstructure; and
  developing the light-sensitive coating, whereby the microstructure is formed on the substrate;
wherein the projection system comprises the objective of claim 30.

* * * * *